(12) United States Patent
Son et al.

(10) Patent No.: US 10,330,842 B2
(45) Date of Patent: Jun. 25, 2019

(54) POLARIZER AND DISPLAY DEVICE COMPRISING THE SAME

(71) Applicant: Samsung Display Co., Ltd., Yongin-si, Gyeonggi-do (KR)

(72) Inventors: Junghee Son, Asan-si (KR); Woosuk Jung, Cheonan-si (KR); Hyejung Park, Cheonan-si (KR); Dukjin Lee, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/935,842

(22) Filed: Mar. 26, 2018

(65) Prior Publication Data
US 2018/0217310 A1    Aug. 2, 2018

Related U.S. Application Data

(62) Division of application No. 14/958,795, filed on Dec. 3, 2015, now Pat. No. 9,952,369.

(30) Foreign Application Priority Data

Mar. 10, 2015    (KR) ..................... 10-2015-0033329

(51) Int. Cl.
*H01L 51/00*    (2006.01)
*G02B 5/30*    (2006.01)
(Continued)

(52) U.S. Cl.
CPC ......... *G02B 5/3083* (2013.01); *G02B 5/3016* (2013.01); *G02B 27/286* (2013.01);
(Continued)

(58) Field of Classification Search
None
See application file for complete search history.

(56) References Cited

U.S. PATENT DOCUMENTS

| 6,261,649 B1 | 7/2001 | Takagi et al. |
| 2005/0127820 A1 | 6/2005 | Yamazaki et al. |

(Continued)

FOREIGN PATENT DOCUMENTS

| EP | 2 541 638 A2 | 1/2013 |
| KR | 10-2002-0090864 A | 12/2002 |

(Continued)

OTHER PUBLICATIONS

Extended European Search Report dated Jul. 28, 2016 for European Patent Application No. EP 16 158 811.6.

(Continued)

*Primary Examiner* — Fernando L Toledo
*Assistant Examiner* — Valerie N Newton
(74) *Attorney, Agent, or Firm* — Lewis Roca Rothgerber Christie LLP

(57) ABSTRACT

A polarizer for a display device is disclosed. In one aspect, the polarizer includes a linear polarizer and a phase retardation layer on the linear polarizer and comprising a quarter-wave plate and a half-wave plate. The half-wave plate includes a refractive index anisotropic layer. The refractive index anisotropic layer has a refractive index Nx defined in a direction of an x axis, a refractive index Ny defined in a direction of a y axis, and a refractive index Nz defined in a direction of a z axis, wherein Nx=Nz>Ny.

15 Claims, 5 Drawing Sheets

(51) Int. Cl.
    *G02B 27/28*   (2006.01)
    *H01L 51/52*   (2006.01)
    *H01L 27/32*   (2006.01)

(52) U.S. Cl.
    CPC ........ *H01L 51/004* (2013.01); *H01L 51/0076* (2013.01); *H01L 51/5237* (2013.01); *H01L 51/5275* (2013.01); *H01L 51/5281* (2013.01); *H01L 27/3244* (2013.01); *H01L 51/5256* (2013.01); *H01L 2251/5315* (2013.01); *H01L 2251/558* (2013.01)

(56)          References Cited

U.S. PATENT DOCUMENTS

| 2006/0083867 | A1 | 4/2006  | Ito et al.      |
|--------------|----|---------|-----------------|
| 2008/0291389 | A1 | 11/2008 | Kawamoto et al. |
| 2009/0219472 | A1 | 9/2009  | Fujita et al.   |
| 2011/0001906 | A1 | 1/2011  | Chang et al.    |
| 2011/0129598 | A1 | 6/2011  | Yoon et al.     |
| 2014/0168768 | A1 | 6/2014  | Seo et al.      |
| 2016/0188119 | A1 | 6/2016  | Ham et al.      |

FOREIGN PATENT DOCUMENTS

| KR | 10-2006-0014357 A | 2/2006  |
|----|-------------------|---------|
| KR | 10-2007-0035822 A | 4/2007  |
| KR | 10-2007-0089078 A | 8/2007  |
| KR | 10-2013-0136747 A | 12/2013 |

OTHER PUBLICATIONS

EPO Office Action dated Sep. 5, 2018, for corresponding European Patent Application No. 16158811.6 (4 pages).

POLARIZER AND DISPLAY DEVICE COMPRISING THE SAME

CROSS-REFERENCE TO RELATED APPLICATION

This application is a divisional of U.S. patent application Ser. No. 14/958,795, entitled POLARIZER AND DISPLAY DEVICE COMPRISING THE SAME, and filed on Dec. 3, 2015, which claims priority to and the benefit of Korean Patent Application No. 10-2015-0033329, filed on Mar. 10, 2015, with the Korean Intellectual Property Office, the disclosure of which is incorporated herein in its entirety by reference.

BACKGROUND

Field

The described technology generally relates to a polarizer and a display device including the same.

Description of the Related Technology

Organic light-emitting diode (OLED) displays generate images without the use of a backlight, unlike a liquid crystal display (LCD), and thus, they can have thinner profile and be lightweight. Further, OLED displays have favorable characteristics, such as low power consumption, high luminance, and rapid response rate, and thus, they have drawn attention as a next generation display device.

OLED displays generally include various types of electrodes and wirings which reflect light from external sources such as ambient light. Due to such reflection, an OLED display has difficulty in representing the deepest black in a relatively bright environment and exhibits a relatively lower contrast ratio.

Typically, in order to prevent reflection of external light, a polarizer film is formed over the pixels.

It is to be understood that this background of the technology section is intended to provide useful background for understanding the technology and as such disclosed herein, the technology background section can include ideas, concepts or recognitions that were not part of what was known or appreciated by those skilled in the pertinent art prior to a corresponding effective filing date of subject matter disclosed herein.

SUMMARY OF CERTAIN INVENTIVE ASPECTS

One inventive aspect relates to a polarizer that can effectively prevent reflection of external light and a display device including the same.

Another aspect is a polarizer that includes: a linear polarizer; and a phase retardation layer disposed on the linear polarizer and including a quarter-wave plate and a half-wave plate, wherein the half-wave plate includes a refractive index anisotropic layer, the refractive index anisotropic layer has a refractive index Nx in a direction of an x axis, a refractive index Ny in a direction of a y axis, and a refractive index Nz in a direction of a z axis, and Nx=Nz>Ny.

The refractive index anisotropic layer can include a liquid crystal layer.

The liquid crystal layer can include a discotic compound.

The discotic compound can have a disc surface, and the disc surface can have an inclination angle in a range of about 60 degrees to about 90 degrees with respect to a surface of the half-wave plate.

Nx and Nz can be in a range of about 1.6 to about 1.8. Ny can be in a range of about 1.5 to about 1.7.

A difference between Nx and Ny can be in a range of about 0.05 to about 0.2.

The refractive index anisotropic layer can have a thickness in a range of about 1 micrometer ($\mu$m) to about 5 $\mu$m.

The refractive index anisotropic layer can have a thickness of "a" $\mu$m, and when Nx−Ny="b", 0.1<a×b<0.5.

The half-wave plate can include an alignment layer, and the refractive index anisotropic layer can be disposed on the alignment layer.

The quarter-wave plate can include a cyclic olefin polymer (COP).

The quarter-wave plate can be disposed on the linear polarizer, and the half-wave plate can be disposed on the quarter-wave plate.

The half-wave plate can be disposed on the linear polarizer, and the quarter-wave plate can be disposed on the half-wave plate.

Another aspect is a display device that includes: a display panel; and a polarizer disposed on the display panel, wherein the polarizer includes: a linear polarizer; and a phase retardation layer disposed on the linear polarizer and including a quarter-wave plate and a half-wave plate, the half-wave plate includes a refractive index anisotropic layer, the refractive index anisotropic layer has a refractive index Nx in a direction of an x axis, a refractive index Ny in a direction of a y axis, and a refractive index Nz in a direction of a z axis, and Nx=Nz>Ny.

The refractive index anisotropic layer can include a liquid crystal layer.

The liquid crystal layer can include a discotic compound.

The discotic compound can have a disc surface, and the disc surface can have an inclination angle in a range of about 60 degrees to about 90 degrees with respect to a surface of the half-wave plate.

Nx and Nz can be in a range of about 1.6 to about 1.8. Ny can be in a range of about 1.5 to about 1.7.

A difference between Nx and Ny can be in a range of about 0.05 to about 0.2.

The refractive index anisotropic layer can have a thickness in a range of about 1 $\mu$m to about 5 $\mu$m.

The refractive index anisotropic layer can have a thickness of "a" $\mu$m, and when Nx−Ny="b", 0.1<a×b<0.5.

The half-wave plate can further include an alignment layer, and the refractive index anisotropic layer is disposed on the alignment layer.

The quarter-wave plate can include a COP.

The quarter-wave plate can be disposed on the linear polarizer, and the half-wave plate can be disposed on the quarter-wave plate.

The half-wave plate can be disposed on the linear polarizer, and the quarter-wave plate can be disposed on the half-wave plate.

The display panel can include: a first substrate; a first electrode disposed on the first substrate; an organic light emitting layer disposed on the first substrate; and a second electrode disposed on the organic light emitting layer.

The display device can further include: a second substrate disposed on the second electrode, wherein the polarizer is disposed on the second substrate.

The display device can further include: a thin film encapsulation layer disposed on the second electrode, wherein the polarizer is disposed on the thin film encapsulation layer.

Another aspect is a polarizer, comprising: a linear polarizer; and a phase retardation layer on the linear polarizer and comprising a quarter-wave plate and a half-wave plate, wherein the half-wave plate comprises a refractive index anisotropic layer, wherein the refractive index anisotropic layer has a refractive index Nx defined in a direction of an x axis, a refractive index Ny defined in a direction of a y axis, and a refractive index Nz defined in a direction of a z axis, and wherein Nx=Nz>Ny.

In the above polarizer, the refractive index anisotropic layer comprises a liquid crystal layer. In the above polarizer, the liquid crystal layer comprises a discotic compound. In the above polarizer, the discotic compound has a disc surface, and wherein the disc surface has an inclination angle in the range of about 60 degrees to about 90 degrees with respect to a surface of the half-wave plate. In the above polarizer, each of Nx and Nz is in the range of about 1.6 to about 1.8. In the above polarizer, Ny is in the range of about 1.5 to about 1.7. In the above polarizer, the difference between Nx and Ny is in the range of about 0.05 to about 0.2. In the above polarizer, the refractive index anisotropic layer has a thickness in the range of about 1 micrometer (μm) to about 5 μm.

In the above polarizer, the refractive index anisotropic layer has a thickness of "a" μm, and wherein "b"=Nx−Ny, where 0.1<a×b<0.5. In the above polarizer, the half-wave plate comprises an alignment layer, and wherein the refractive index anisotropic layer is on the alignment layer. In the above polarizer, the quarter-wave plate comprises a cyclic olefin polymer (COP). In the above polarizer, the quarter-wave plate is on the linear polarizer, and wherein the half-wave plate is on the quarter-wave plate. In the above polarizer, the half-wave plate is on the linear polarizer, and wherein the quarter-wave plate is on the half-wave plate.

Another aspect is a display device, comprising: a display panel; and a polarizer on the display panel, wherein the polarizer comprises: a linear polarizer; and a phase retardation layer on the linear polarizer and comprising a quarter-wave plate and a half-wave plate, wherein the half-wave plate comprises a refractive index anisotropic layer, wherein the refractive index anisotropic layer has a refractive index Nx defined in a direction of an x axis, a refractive index Ny defined in a direction of a y axis, and a refractive index Nz defined in a direction of a z axis, and wherein Nx=Nz>Ny.

In the above display device, the refractive index anisotropic layer comprises a liquid crystal layer. In the above display device, the liquid crystal layer comprises a discotic compound. In the above display device, the discotic compound has a disc surface, and wherein the disc surface has an inclination angle in the range of about 60 degrees to about 90 degrees with respect to a surface of the half-wave plate. In the above display device, each of Nx and Nz is in the range of about 1.6 to about 1.8. In the above display device, Ny is in the range of about 1.5 to about 1.7. In the above display device, the difference between Nx and Ny is in a range of about 0.05 to about 0.2. In the above display device, refractive index anisotropic layer has a thickness in the range of about 1 micrometer (μm) to about 5 μm. In the above display device, the refractive index anisotropic layer has a thickness of "a" μm, and wherein Nx−Ny="b", 0.1<a×b<0.5.

In the above display device, the half-wave plate further comprises an alignment layer, and wherein the refractive index anisotropic layer is on the alignment layer. In the above display device, the quarter-wave plate comprises a cyclic olefin polymer (COP). In the above display device, the quarter-wave plate is on the linear polarizer, and wherein the half-wave plate is on the quarter-wave plate. In the above display device, the half-wave plate is on the linear polarizer, and wherein the quarter-wave plate is on the half-wave plate. In the above display device, the display panel comprises: a first substrate; a first electrode on the first substrate; an organic light emitting layer on the first substrate; and a second electrode on the organic light emitting layer. The above display device further comprises a second substrate on the second electrode, wherein the polarizer is on the second substrate. The above display device further comprises a thin film encapsulation layer on the second electrode, wherein the polarizer is on the thin film encapsulation layer.

Another aspect is a polarizer, comprising: a linear polarizer; and a quarter-wave plate on the linear polarizer; and a half-wave plate on the quarter-wave plate and comprising a refractive index anisotropic layer, wherein the refractive index anisotropic layer has a refractive index Nx defined in a direction of an x axis, a refractive index Ny defined in a direction of a y axis, and a refractive index Nz defined in a direction of a z axis, and wherein Nx=Nz>Ny.

In the above display device, each of the half-wave and quarter-wave plates is thinner than the linear polarizer.

DETAILED DESCRIPTION OF CERTAIN INVENTIVE EMBODIMENTS

Figure 1:
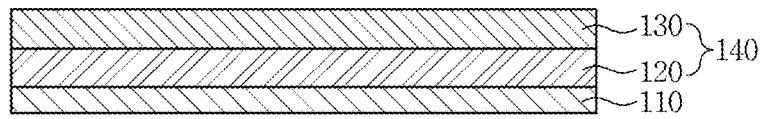
FIG. 1 is a cross-sectional view illustrating a polarizer according to a first exemplary embodiment.

Exemplary embodiments will now be described more fully hereinafter with reference to the accompanying drawings; however, they can be embodied in different forms and should not be construed as limited to the exemplary embodiments set forth herein. Rather, these exemplary embodiments are provided so that this disclosure will be thorough and complete, and will fully convey exemplary implementations to those skilled in the art.

All terminologies used herein are merely used to describe exemplary embodiments and can be modified according to the relevant art and the intention of an applicant. Therefore, the terms used herein should be interpreted as having a meaning that is consistent with their meanings in the context of the present disclosure, and is not intended to limit the exemplary embodiments.

In the drawings, certain elements or shapes can be simplified or exaggerated to better illustrate the described technology, and other elements present in an actual product can also be omitted. Thus, the drawings are intended to facilitate the understanding of the described technology. Like reference numerals refer to like elements throughout the specification.

When a layer or element is referred to as being "on" another layer or element, the layer or element can be directly on the other layer or element, or one or more intervening layers or elements can be interposed therebetween. In this disclosure, the term "substantially" includes the meanings of completely, almost completely or to any significant degree under some applications and in accordance with those skilled in the art. The term "connected" can include an electrical connection.

Hereinafter, a first exemplary embodiment will be described with reference to FIGS. 1 through 3.

Figure 2:
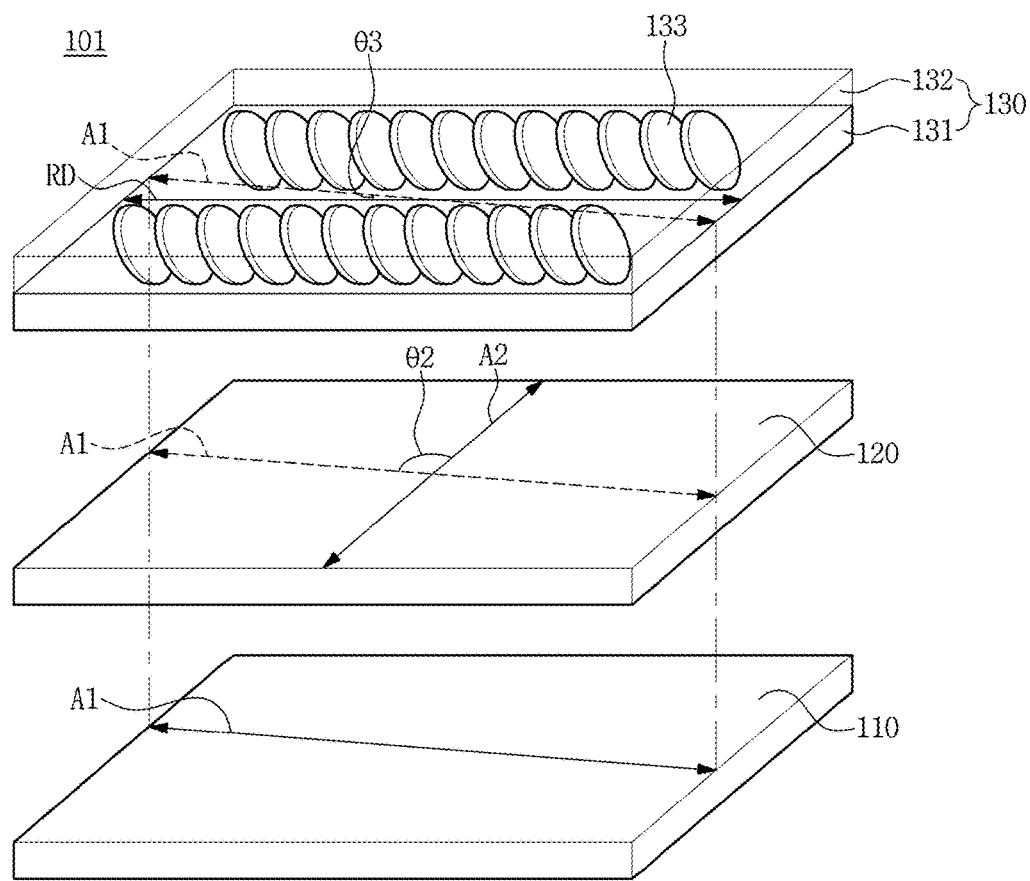
FIG. 2 is an exploded perspective view of FIG. 1.

FIG. 1 is a cross-sectional view illustrating a polarizer 101 according to the first exemplary embodiment. FIG. 2 is an exploded perspective view of FIG. 1.

The polarizer 101 according to the first exemplary embodiment can include a linear polarizer 110 and a phase retardation layer 140 formed on the linear polarizer 110. The polarizer 101 can serve to prevent reflection of external light.

The linear polarizer 110 can serve to linearly polarize an external light incident on the polarizer 101.

The linear polarizer 110 can use a film obtained by a dichroic dye being adsorbed onto and aligned in a polyvinyl alcohol (PVA) resin. Examples of the PVA resin can include a homopolymer of vinyl acetate or a copolymer of a monomer different from vinyl acetate.

The polarizer 101 can be prepared through a scheme including, for example, a process of uniaxially stretching a PVA resin film, a process of dyeing the PVA resin film with a dichroic dye such that the dichroic dye is adsorbed onto the PVA resin film, a process of treating the PVA resin film, onto which the dichroic dye is adsorbed, using a boron aqueous solution, and a washing process. However, the scheme of manufacturing the linear polarizer 110 according to the first exemplary embodiment is not limited thereto.

The dichroic dye can use, for example, iodine and another dichroic dye used in the pertinent art. In the case of using iodine as the dichroic dye, the linear polarizer 110 can be prepared through a process of dyeing the PVA resin film by immersing the PVA resin film in an aqueous solution containing iodine and potassium iodide.

Iodine can be arranged in a direction parallel to a direction in which the PVA resin film is stretched. A transmission axis A1 of the linear polarizer 110 can be determined based on the arrangement of iodine, and the transmission axis A1 of the linear polarizer 110 can be substantially parallel to the direction of the arrangement of iodine.

A thickness of the linear polarizer 110 can vary based on a product to which the linear polarizer 110 is to be applied. For example, the linear polarizer 110 has a thickness in the range of about 5 micrometers (μm) to about 50 μm.

The phase retardation layer 140 can be formed on a surface of the linear polarizer 110.

The phase retardation layer 140 can retard a phase of light. The phase retardation layer 140 can convert a linearly polarized light to a circularly polarized light, or can convert a circularly polarized light to a linearly polarized light. For example, an external light incident on the polarizer 101 is linearly polarized by the linear polarizer 110, or circularly polarized by the phase retardation layer 140. The circularly polarized external light can be reflected within a device to which the polarizer 101 is attached, for example, a display device, to thereby be converted to a reflected light. During the reflection process, a phase and a polarization axis of the light can vary. In some embodiments, the reflected light with the varied phase does not pass through the polarizer 101, and thus, reflection of the external light can be prevented by the polarizer 101.

The phase retardation layer 140 can use a phase difference plate having a film shape. For example, a single layer of the phase difference plate is used, or a plurality of layers of the phase difference plate are stacked to be used.

The phase retardation layer 140 according to the first exemplary embodiment can include a quarter-wave plate (QWP) 120 and a half-wave plate (HWP) 130.

For example, the phase retardation layer 140 can include the QWP 120 formed on the linear polarizer 110 and the HWP 130 formed on the QWP 120. However, the first exemplary embodiment is not limited thereto, and the HWP 130 can be formed on the linear polarizer 110 and the QWP 120 can be formed on the HWP 130.

The QWP 120 can be prepared by stretching a film. For example, the QWP 120 is be prepared by stretching a film formed of polycarbonate (PC), polyvinyl alcohol (PVA), polystyrene (PS), poly(methyl methacrylate) (PMMA), polypropylene (PP), polyolefin, polyarylate (PAR), or polyamide (PA).

The QWP 120 can include a film formed of a cyclic olefin polymer (COP). The COP film can be prepared using, for example, a norbornene-based COP. The COP film can have high light transmittance, high thermal resistance, high strength, low moisture absorption, and high cost-efficiency. A phase difference plate formed of such a COP film can represent a relatively stable phase retardation value, irrespective of a wavelength of incident light.

In addition, the QWP 120 can be prepared using a photocurable liquid crystal compound. For example, an alignment layer is formed on a base film, and liquid crystal compounds is arranged on the alignment layer to be patterned thereon, such that the QWP 120 can be prepared. In this instance, based on the alignment layer and the arrangement of the liquid crystal compounds, the type of the phase difference plate to be prepared, that is, whether the quarter-wave plate or the half-wave plate, can be determined.

The type or the manufacturing scheme of the QWP 120 is not limited to the above description.

The QWP 120 can have a transmission axis A2. The transmission axis A2 of the QWP 120 can be determined by a stretching axis of a film or a direction in which the liquid crystal compounds are aligned.

The QWP 120 according to the first exemplary embodiment can be prepared by stretching the COP film, and the transmission axis A2 of the QWP 120 can be substantially parallel to a stretching axis of the COP film.

The QWP 120 according to the first exemplary embodiment can be designed to be optimized for preventing reflection of an external light incident frontwards, that is, an external light vertically incident on a surface of the polarizer 101. Accordingly, in a case of a polarizer using only the QWP 120 as the phase retardation plate 140, reflection of an external light incident on the polarizer at a predetermined incident angle is not effectively prevented by the polarizer. In other words, in the case of using only the QWP 120 as the phase retardation layer 140, a path of an external light can vary based on an incident angle of the external light such that a phase retardation effect can change, and the effect of preventing reflection of the external light can also change based on the incident angle.

In this case, when the incident angle of the external light increases, reflectivity of the polarizer can increase, and when a viewing angle of a user increases, an amount of reflected light to be visible to the user can increase.

In order to prevent the increase in reflectivity of the polarizer in response to the increase in the incident angle of the external light, the HWP 130 can be used along with the QWP 120.

The HWP 130 according to the first exemplary embodiment can have a refractive index anisotropic layer.

The refractive index anisotropic layer can have a refractive index Nx in a direction of an x axis, a refractive index Ny in a direction of a y axis, and a refractive index Nz in a direction of a z axis, and a relationship thereamong in which "Nx=Nz>Ny" can be satisfied. A phase difference plate satisfying the relationship in which "Nx=Nz>Ny" can be referred to as a negative A-plate.

Figure 3:
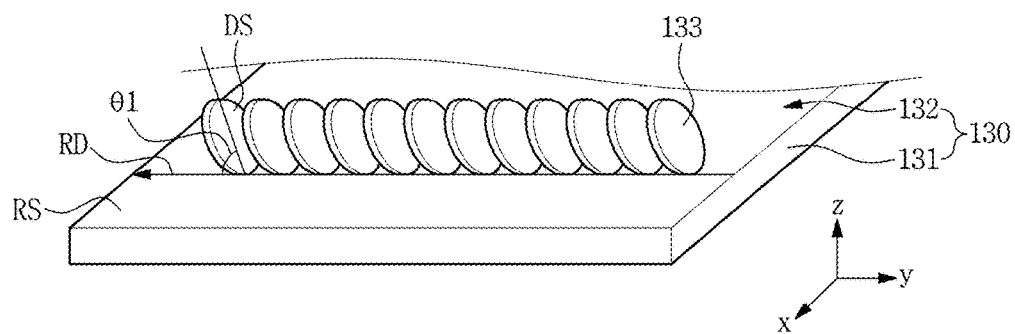
FIG. 3 is a structural view illustrating a half-wave plate.

FIG. 3 is a structural view illustrating the HWP 130. The HWP 130 of FIG. 3 can include a liquid crystal layer 132 as the refractive index anisotropic layer.

In detail, the HWP 130 according to the first exemplary embodiment can include a support member 131 and the liquid crystal layer 132 formed on the support member 131. The liquid crystal layer 132 can have a refractive index anisotropy.

The support member 131 can serve to support the liquid crystal layer 132. The support member 131 can be formed of a transparent plastic film and can include, for example, one or more of the following materials: tri-acetyl cellulose (TAC), polyethylene terephthalate (PET), polyimide (PI), and polycarbonate (PC).

In addition, an alignment layer can be used as the support member 131. A description pertaining to the alignment layer will be provided further below.

The liquid crystal layer 132 can include a discotic compound 133. For example, the liquid crystal layer 132 can include a binder compound, and the discotic compounds 133 can be arranged through being dispersed in the binder compound. The liquid crystal layer 132 including the discotic compound 133 can also be referred to as a discotic liquid crystal layer.

The discotic compound 133 of FIG. 3 can have a predetermined inclination angle θ1 with respect to a surface of the HWP 130. In detail, the discotic compound 133 of FIG. 3 can have a disc surface DS, and the disc surface DS can have an inclination angle θ1 in the range of about 60 degrees to about 90 degrees with respect to a surface RS of the support member 131.

In general, the inclination angle θ1 of the discotic compound 133 can vary based on the type of the discotic compound 133, the alignment scheme of the discotic compound 133, the type of material used in the alignment of the discotic compound 133, and the type of alignment layer.

The liquid crystal layer 132 can be prepared by aligning the discotic compound 133 using the alignment layer and fixing the discotic compound 133 in the aligned state.

A discotic compound known to those skilled in the art can be used to form the liquid crystal layer 132, and a polymerization scheme known to those skilled in the art can be used to fix the discotic compound 133.

For example, to fix the discotic compound 133 by polymerization, a compound having a polymerizable group is used. Examples of the compound having the polymerizable group include a monomer or an oligomer. In this instance, a linking group can be introduced between the discotic compound 133 and the polymerizable group. For example, the liquid crystal layer 132 can include a compound expressed by Formula 1.

$$D\text{-}(L\text{-}P)_n \quad \text{[Formula 1]}$$

In Formula 1, "D" denotes the discotic compound 133, "L" denotes the linking group, and "P" denotes the polymerizable group. "n" denotes an integer in the range of 4 to 12.

The liquid crystal layer 132 can be prepared by coating, drying, and heating a composition for forming a liquid crystal layer including the discotic compound 133 up to a temperature at which a discotic nematic phase is formed, on the alignment layer and then polymerizing and cooling the composition for forming the liquid crystal layer. The temperature for forming the discotic nematic phase can be in the range of about 70 degrees Celsius (° C.) to about 300° C., which is lower than a thermal deformation temperature of the alignment layer, and more particularly, in the range of about 70° C. to about 170° C.

The composition for forming the liquid crystal layer can include the discotic compound 133 in an amount of about 1 percentage by weight (wt %) to about 70 wt % with respect to a total weight of the composition for forming the liquid crystal layer.

In addition, the composition for forming the liquid crystal layer can further include a polymerizable monomer, a polymerization initiator, and an additive, in addition to the discotic compound 133.

The polymerizable monomer can use a monomer having a vinyl group, a vinyloxy group, an acryl group, and a methacryl group. The composition for forming the liquid crystal layer can include the polymerizable monomer in an amount of about 1 wt % to about 50 wt % with respect to the total weight of the composition for forming the liquid crystal layer.

The additive can use a polymer, a plasticizer, and a surfactant.

The polymer can use a polymer which is highly compatible with the discotic compound 133. An example of such a polymer includes a cellulose ester polymer. Examples of the cellulose ester polymer include cellulose acetate, cellulose acetate propionate, hydroxypropyl cellulose, cellulose acetate butyrate, and the like. The composition for forming the liquid crystal layer can include the polymer in an amount of about 1 wt % to about 30 wt % with respect to the total weight of the composition for forming the liquid crystal layer.

The plasticizer and the surfactant can use any plasticizer and surfactant commonly used in manufacturing a polymerizable composition.

The polymerization initiator can use a photopolymerization initiator and a thermal polymerization initiator.

The polymerization scheme of the composition for forming the liquid crystal layer can include a thermal polymerization scheme using a thermal polymerization initiator and a photopolymerization scheme using a photopolymerization initiator. In particular, in order to maintain the aligned state of the discotic compound 133 and polymerize the composition for forming the liquid crystal layer, the photopolymerization scheme can be used.

For the photopolymerization, the composition for forming the liquid crystal layer can include a photopolymerization initiator. Examples of the photopolymerization initiator include one or more of the following materials: an α-carbonyl compound, acyloin ether, an α-hydrocarbon-substituted aromatic acyloin compound, a polynuclear quinone compound, a combination of triarylimidazole dimer and p-aminophenylketone, an acridine compound, a phenazine compound, and an oxadiazole compound. The composition for forming the liquid crystal layer can include the photopolymerization initiator in an amount of about 0.01 wt % to about 20 wt % with respect to the total weight of the composition for forming the liquid crystal layer.

For the photopolymerization of the composition for forming the liquid crystal layer, light can be irradiated on the composition for forming the liquid crystal layer. Such light to be irradiated thereon can use ultraviolet (UV) light having energy in the range of about 20 millijoules per square centimeter (mJ/cm$^2$) to about 5000 mJ/cm$^2$. The light irradiation can be conducted during the heating process in order to accelerate the photopolymerization reaction.

The composition for forming the liquid crystal layer can be cured to thereby form the liquid crystal layer 132 and to fix the discotic compound 133.

As such, as the discotic compounds 133 are arranged at an inclination angle θ1 in the range of about 60 degrees to about 90 degrees, the liquid crystal layer 132 can have the refractive index Nx in the direction of the x axis and the refractive index Nz in the direction of the z axis in the range of about 1.6 to about 1.8, and the refractive index Ny in the direction of the y axis in the range of about 1.5 to about 1.7. In addition, a difference between Nx and Ny can have a value in the range of about 0.05 to about 0.2.

However, the first exemplary embodiment is not limited thereto, and the refractive index Nx in the direction of the x axis, the refractive index Ny in the direction of the y axis, and the refractive index Nz in the direction of the z axis can vary based on the materials forming the liquid crystal layer 132 and the arrangement of the materials.

A thickness of the liquid crystal layer 132 can be adjusted to allow phase retardation, which is required for circular polarization, to occur. The thickness of the liquid crystal layer 132 can vary based on a refractive index of the liquid crystal layer 132. The liquid crystal layer 132 according to the first exemplary embodiment can have a thickness in the range of about 1 µm to about 5 µm.

In addition, in order to compensate for a phase retardation variation based on an incident angle of an external light, a thickness and a refractive index of the liquid crystal layer 132 can be adjusted to satisfy the following relationship. For example, when the liquid crystal layer 132 has a thickness of "a" µm and a difference between the refractive index Nx and the refractive index Ny is given by an equation in which "Nx−Ny=b", the thickness and the refractive index of the liquid crystal layer 132 is adjusted so as to satisfy the relationship in which "0.1≤a×b≤0.5".

In a case in which a value calculated by "a×b" is in the range of about 0.1 to about 0.5, a phase retardation variation in the range of about 100 nanometers (nm) to about 500 nm can be compensated. For example, even in the case in which a laterally incident external light has the phase retardation variation in the range of about 100 nm to about 500 nm, as compared to an external light incident frontwards, the laterally incident external light can be circularly polarized by the polarizer 101.

More particularly, the value calculated by "a×b" can be in the range of about 0.2 to about 0.3. In this case, the phase retardation variation can be compensated in the range of about 200 nm to about 300 nm.

In the case of using the liquid crystal layer 132 as the refractive index anisotropic layer of the HWP 130, circular polarization of the external light can occur by the polarizer 101 despite varying incident angles of the external light. Accordingly, the polarizer 101 including the HWP 130 can effectively prevent reflection of the external light, irrespective of the incident angle of the external light.

The HWP 130 according to the first exemplary embodiment can include an alignment layer, and the alignment layer can function as the support member 131. Accordingly, the liquid crystal layer 132 can be formed on the alignment layer.

The alignment layer can serve to determine an alignment direction of the discotic compound 133.

The alignment layer can be prepared through a rubbing treatment of a polymer, a rhombic vacuum deposition process, a Langmuir-Brojet (LB) process, or the like. In this instance, the polymer for forming the alignment layer can include ω-trycosanoic acid, dioctadecylmethylammonium chloride, methyl stearic acid, and the like.

In detail, the alignment layer can be prepared through a rubbing treatment of a polymer. The polymer for forming the alignment layer can include PVA. In addition, a polymer which is modified through a hydrophobic group being bonded thereto can be used to form the alignment layer. For example, a polymer in which a hydrophobic group is introduced to PVA is used. Due to the affinity of the hydrophobic group with the discotic compound 133, the hydrophobic group can be suitable for uniformly aligning the discotic compound 133.

The hydrophobic group can be bonded to an end of a backbone of PVA or a side chain of PVA.

The hydrophobic group can include an aliphatic group having 6 or more carbon atoms or an aromatic group. For example, an alkyl group or an alkenyl group having 6 or more carbon atoms is used as the hydrophobic group.

In a case of bonding the hydrophobic group to the end of the backbone of PVA, a linking group can be introduced between the hydrophobic group and the end of the backbone of PVA. Examples of the linking group can include —S—, —C(CN)R$_1$—, —NR$_2$—, and the like. As used herein, R$_1$ and R$_2$ each denote a hydrogen atom or an alkyl group having one to 6 carbon atoms.

To prepare the alignment layer, a commercially available PVA film can be used.

The rubbing treatment can be performed by rubbing a surface of a film for forming the alignment layer a few number of times in a predetermined direction. For the rubbing treatment, a cloth in which a fiber has a uniform length and thickness and is uniformly arranged can be used.

The alignment layer can have an alignment direction RD, and in a case of forming the alignment layer by the rubbing treatment, the alignment direction RD can be parallel to a direction of the rubbing treatment. The discotic compound 133 can be aligned based on the alignment direction RD of the alignment layer.

A transmission axis of the liquid crystal layer 132 can be determined based on the alignment direction of the discotic compound 133. The transmission axis of the liquid crystal layer 132 can be a transmission axis of the HWP 130.

The alignment layer is not necessarily required in the polarizer 101, and can be omitted. For example, the alignment layer is omitted in the preparing process of the polarizer 101, subsequently to using the alignment layer for aligning the discotic compound 133. In this case, a transparent base film can be used as the support member 131 for supporting the discotic compound 133, in lieu of the alignment layer.

Further, the support member 131 can be omitted. For example, the liquid crystal layer 132, aligned by the alignment layer, is formed directly on the QWP 120.

Although not illustrated, the polarizer 101 according to the first exemplary embodiment can further include an adhesive layer interposed between the linear polarizer 110 and the QWP 120 and an adhesive layer interposed between the QWP 120 and the HWP 130.

In addition, the linear polarizer 110, the QWP 120, and the HWP 130 can be formed to intersect one another at a predetermined angle to achieve effective reflection of external light.

For example, the QWP 120 is formed to intersect the linear polarizer 110 at an angle of θ2 based on a transmission axis, and the HWP 130 is formed to intersect the linear polarizer 110 at an angle of θ3 based on the transmission axis. As used herein, θ2 is an angle between the transmission axis A1 of the linear polarizer 110 and the transmission axis A2 of the QWP 120, and can be in a range of about 70 degrees to about 80 degrees. In addition, θ3 is an angle between the transmission axis A1 of the linear polarizer 110 and the alignment direction RD of the alignment layer, and can be in the range of about 12 degrees to about 17 degrees.

When the polarizer 101 is formed on the display device, and the like, the y axis can be a direction parallel to a direction in which the range of an incident angle of external light is relatively great when viewed from a user. For example, in a case of using the polarizer 101 in a display device having a greater horizontal length than a vertical width, the y axis can be a direction parallel to the horizontal length of the display device.

Figure 9A:
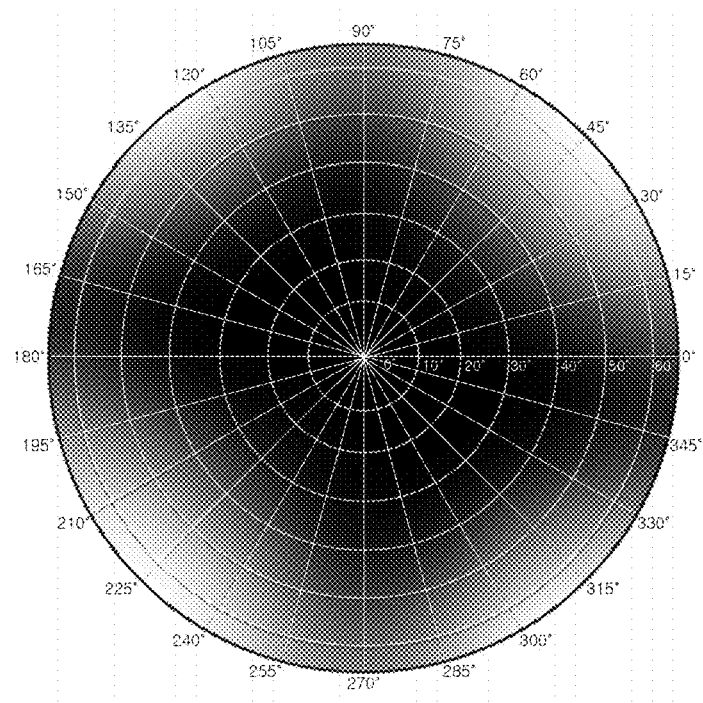
FIGS. 9A and 9B are graphs illustrating results of experiments on reflectivity of a polarizer.
Figure 9B:
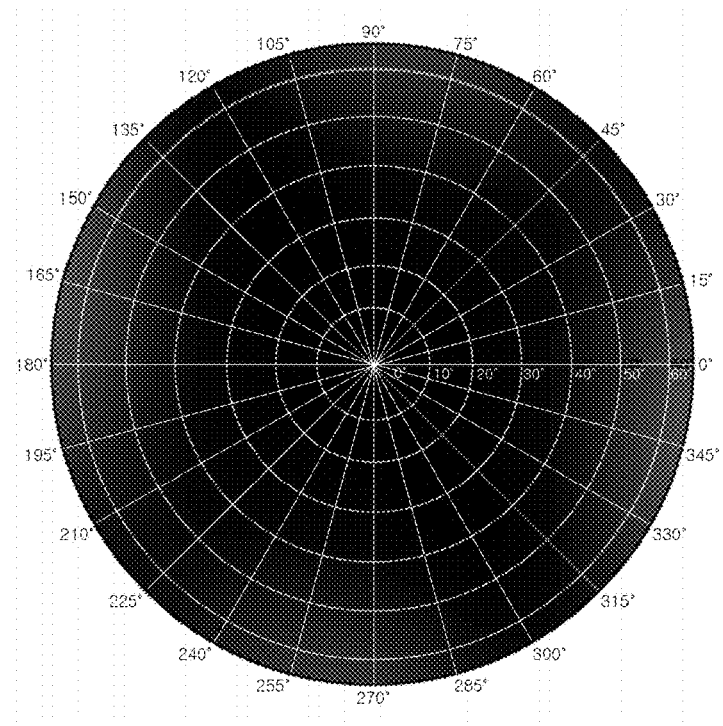

FIGS. 9A and 9B are graphs illustrating results of experiments on reflectivity of a polarizer. FIG. 9A illustrates a result of a simulation experiment on reflectivity of a polarizer including a HWP in which a refractive index anisotropy is absent; and FIG. 9B illustrates a result of a simulation experiment on reflectivity of the polarizer 101 according to the first exemplary embodiment.

In detail, the HWP used in the experiment of FIG. 9A can have a refractive index in which "Nx=Ny=Nz=1.6", and a HWP used in the experiment of FIG. 9B can have a refractive index in which "Nx=Nz=1.77" and "Ny=1.6". A relatively dark portion of FIGS. 9A and 9B indicates a portion in which reflection of external light is effectively prevented, and a relatively bright portion thereof indicates a portion in which relatively low efficiency in preventing reflection of external light is exhibited. As illustrated in FIGS. 9A and 9B, the polarizer 101 according to the first exemplary embodiment can effectively prevent reflection of external light in all directions irrespective of an incident angle of external light and can be excellent in representing a black color.

As such, the polarizer 101 according to the first exemplary embodiment can have the HWP 130 having a negative A-plate property, and can prevent reflection of external light irrespective of an incident angle of external light. Accordingly, a product using the polarizer 101 according to the first exemplary embodiment can be excellent in representing a black color and can have an excellent contrast ratio.

Hereinafter, a second exemplary embodiment will be described with reference to FIG. 4. A repeated description of the aforementioned component will be omitted herein for conciseness.

Figure 4:
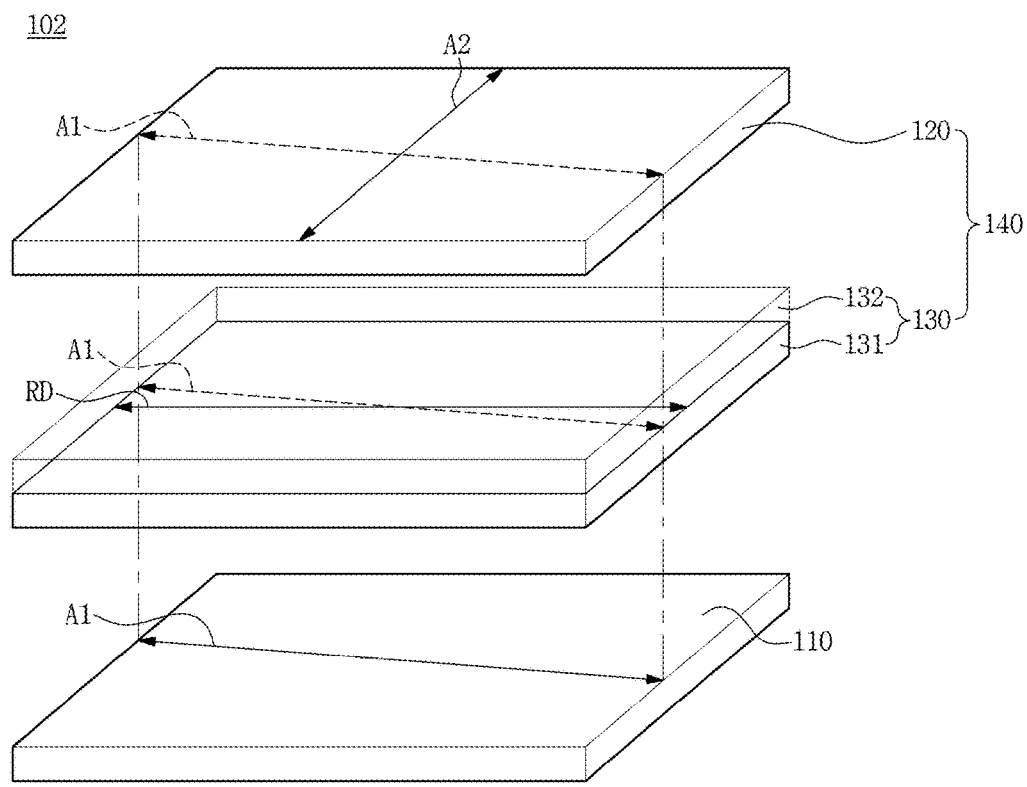
FIG. 4 is an exploded perspective view illustrating a polarizer according to a second exemplary embodiment.

FIG. 4 is an exploded perspective view illustrating a polarizer 102 according to the second exemplary embodiment.

The polarizer 102 according to the second exemplary embodiment includes a linear polarizer 110, a HWP 130 formed on the linear polarizer 110, and a QWP 120 formed on the HWP 130. A configuration of the HWP 130 and the QWP 120 according to the second exemplary embodiment can be the same as that of the first exemplary embodiment.

Hereinafter, a third exemplary embodiment will be described with reference to FIG. 5.

Figure 5:
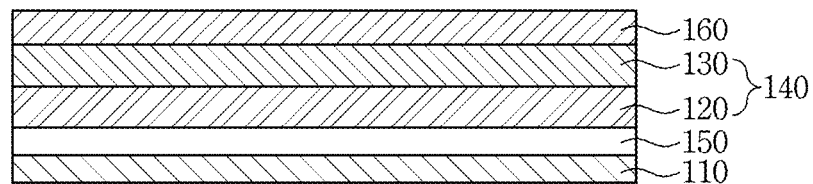
FIG. 5 is a cross-sectional view illustrating a polarizer according to a third exemplary embodiment.

FIG. 5 is a cross-sectional view illustrating a polarizer 103 according to the third exemplary embodiment.

The polarizer 103 according to the third exemplary embodiment can include a linear polarizer 110, a QWP 120, a HWP 130, and a support layer 150 interposed between the linear polarizer 110 and the QWP 120.

The support layer 150 can serve to support and protect the polarizer 103. The support layer 150 can use, for example, a tri-acetyl cellulose (TAC) film. The TAC film can have excellent durability and mechanical strength.

In addition, the polarizer 103 according to the third exemplary embodiment can further include an adhesive layer 160 formed on the HWP 130. The adhesive layer 160 can be formed of an adhesive resin.

Hereinafter, a fourth exemplary embodiment will be described with reference to FIGS. 6 and 7.

Figure 6:
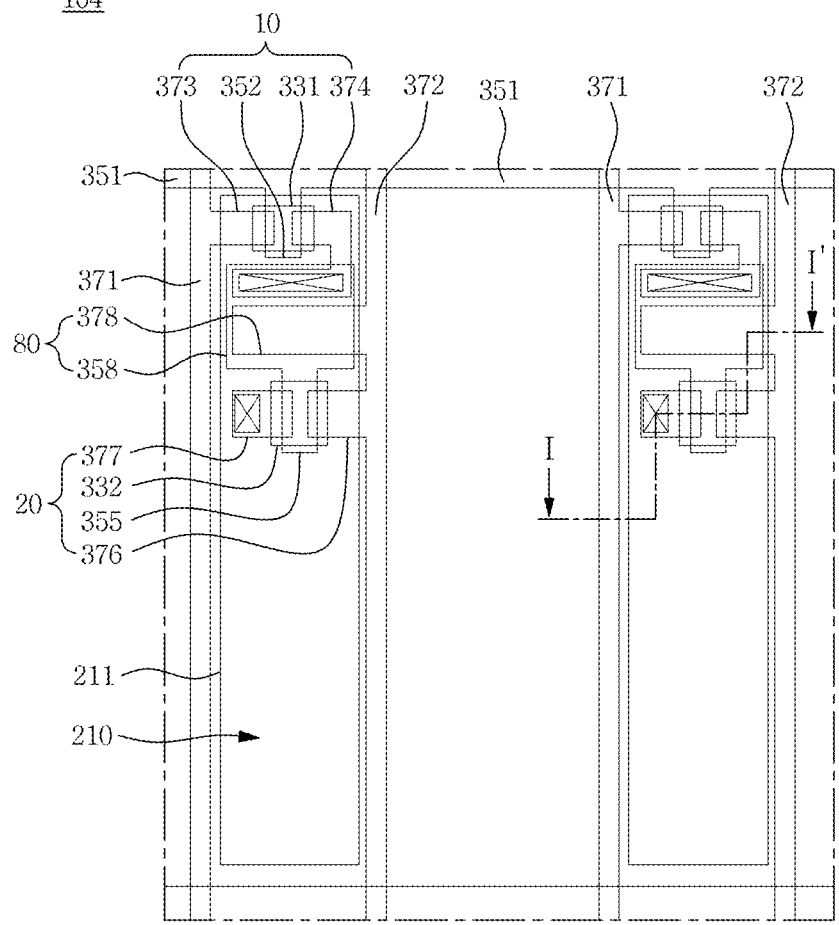
FIG. 6 is a plan view illustrating an organic light-emitting diode (OLED) display device according to a fourth exemplary embodiment.

FIG. 6 is a plan view illustrating an OLED display 104 according to the fourth exemplary embodiment. FIG. 7 is a cross-sectional view taken along line I-I' of FIG. 6.

Figure 7:
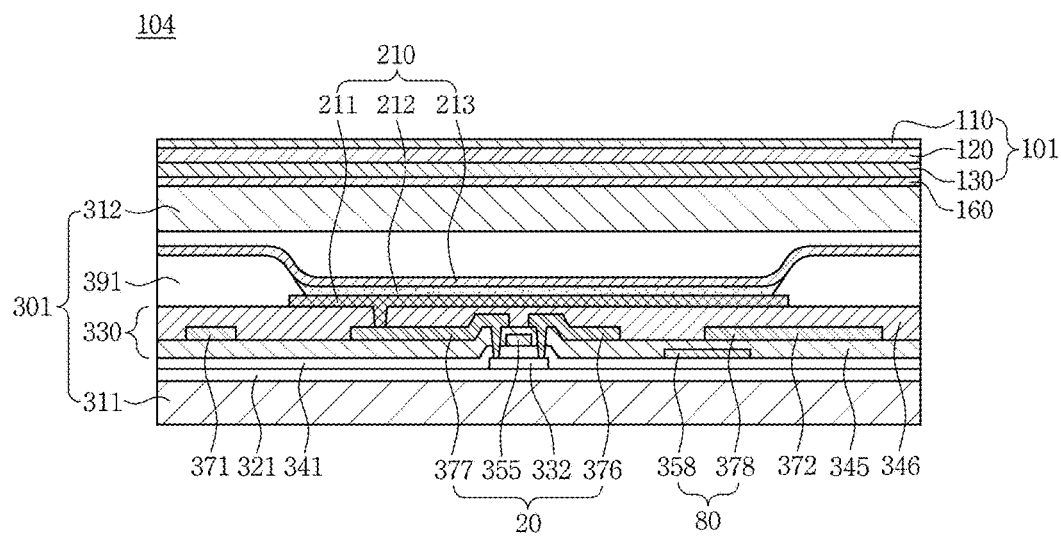
FIG. 7 is a cross-sectional view taken along line I-I' of FIG. 6.

As illustrated in FIGS. 6 and 7, the OLED display 104 according to the fourth exemplary embodiment can include a display panel 301 and a polarizer 101.

The display panel 301 can include a first substrate 311, a wiring unit 330, an OLED 210, and a second substrate 312.

The first substrate 311 can use an insulating substrate formed of one or more of the following materials: glass, quartz, ceramic, and plastic. However, the fourth exemplary embodiment is not limited thereto, and the first substrate 311 can also use a metallic substrate formed of stainless steel, or the like.

A buffer layer 321 can be formed on the first substrate 311. The buffer layer 321 can include one or more of various inorganic and organic layers. The buffer layer 321 can serve to reduce or effectively prevent the infiltration of impure elements such as moisture into the wiring unit 330 or the OLED 210 through the first substrate 311 and can also planarize a surface of the first substrate 311. However, the buffer layer 321 is not necessarily required, and can be omitted.

The wiring unit 330 can be formed on the buffer layer 321. The wiring unit 330 can include a switching thin film transistor (TFT) 10, a driving TFT 20, and a capacitor 80, and can drive the OLED 210. The OLED 210 can display an image by emitting light based on a driving signal transmitted from the wiring unit 330.

FIGS. 6 and 7 illustrate the OLED display 104 as an active matrix organic light emitting diode (AMOLED) display having a 2Tr-1Cap structure in which a single pixel includes two thin film transistors, for example, the switching TFT 10 and the driving TFT 20, and a single capacitor, for example, the capacitor 80. However, the fourth exemplary embodiment is not limited thereto. For example, the OLED display 104 according to the fourth exemplary embodiment can have various structures in which a single pixel includes three or more thin film transistors and two or more capacitors and an additional wiring can further be included. As used herein, the term "pixel" refers to a minimum unit for displaying an image, and the OLED display 104 can display an image through a plurality of pixels.

The switching TFT 10, the driving TFT 20, the capacitor 80, and the OLED 210 can be included in each pixel. In addition, a gate line 351, a data line 371 insulated from and intersecting the gate line 351, and a common power line 372 can be formed in the wiring unit 330. A single pixel can be defined by a boundary among the gate line 351, the data line 371, and the common power line 372. However, the definition of the pixel is not limited thereto. The pixel can be defined by a pixel defining layer (PDL) 391 or a black matrix.

The OLED 210 can include a first electrode 211, an organic light emitting layer 212 formed on the first electrode 211, and a second electrode 213 formed on the organic light emitting layer 212. A hole and an electron from the first electrode 211 and the second electrode 213, respectively, are injected into the organic light emitting layer 212 to be combined with one another to thereby form an exciton. The OLED 210 can emit light by energy generated when the exciton falls from an excited state to a ground state.

The capacitor 80 can include a pair of capacitor plates 358 and 378, which are formed to have an insulating interlayer 345 therebetween. In this instance, the insulating interlayer 345 can be a dielectric material. Capacitance of the capacitor 80 can be determined by an amount of electric charges stored in the capacitor 80 and a level of a voltage between the capacitor plates 358 and 378.

The switching TFT 10 can include a switching semiconductor layer 331, a switching gate electrode 352, a switching source electrode 373, and a switching drain electrode 374. The driving TFT 20 can include a driving semiconductor layer 332, a driving gate electrode 355, a driving source electrode 376, and a driving drain electrode 377. The switching semiconductor layer 331 can be insulated from the switching gate electrode 352 by a gate insulating layer 341, and the driving semiconductor layer 332 can be insulated from the driving gate electrode 355 by the gate insulating layer 341.

The switching TFT 10 can be used as a switching element that selects a pixel to perform light emission. The switching gate electrode 352 can be connected to the gate line 351. The switching source electrode 373 can be connected to the data line 371. The switching drain electrode 374 can be formed to be spaced apart from the switching source electrode 373 and can be connected to one of the capacitor plates, for example, the capacitor plate 358.

The driving TFT 20 can apply, to the first electrode 211, a driving power for allowing the organic light emitting layer 212 of the OLED 210 in the pixel selected by the switching TFT 10, to perform light emission. The driving gate electrode 355 can be connected to the capacitor plate 358, which is connected to the switching drain electrode 374. The driving source electrode 376 and the other capacitor plate 378 can be connected to the common power line 372. The driving drain electrode 377 can be connected to the first electrode 211 of the OLED 210 through a contact hole.

Due to the configuration of the switching TFT 10 and the driving TFT 20 as described above, the switching TFT 10 can be operated by a gate voltage applied to the gate line 351 to thereby transmit a data voltage applied to the data line 371 to the driving TFT 20. A voltage having a level that is substantially equal to a difference between a level of a data voltage transmitted by (or from) the switching TFT 10 and a level of a common voltage applied from the common power line 372 to the driving TFT 20 can be stored in the capacitor 80. A current having a level equivalent to the level of the voltage stored in the capacitor 80 can flow into the OLED 210 through the driving TFT 20 such that the OLED 210 can emit light.

In the fourth exemplary embodiment, the first electrode 211 can be an anode that injects holes and the second electrode 213 can be a cathode that injects electrons. However, the fourth exemplary embodiment is not limited thereto, and can be modified such that the first electrode 211 is a cathode and the second electrode 213 is an anode.

A planarization layer 346 can be formed on the insulating interlayer 345. The planarization layer 346 can be formed of an insulating material, and can protect the wiring unit 330. The planarization layer 346 and the insulating interlayer 345 can be formed of the same material.

The drain electrode 377 of the driving TFT 20 can be connected to the first electrode 211 of the OLED 210 through the contact hole formed in the planarization layer 346.

In the fourth exemplary embodiment, the first electrode 211 can include a reflective layer and the second electrode 213 can include a transflective layer. Accordingly, a light generated in the organic light emitting layer 212 can be transmitted through the second electrode 213 to be emitted. For example, the OLED display 104 according to the fourth exemplary embodiment is a top-emission-type display device.

The reflective layer and the transflective layer can be formed of one or more of the following metals: magnesium (Mg), silver (Ag), gold (Au), calcium (Ca), lithium (Li), chromium (Cr), aluminum (Al), and copper (Cu) or an alloy thereof. In this instance, the type of the layer, that is, whether the reflective layer or the transflective layer, can be determined based on a thickness of the layer. In general, the transflective layer has a thickness of less than or equal to about 200 nm. As the thickness of the transflective layer decreases, a level of light transmittance can increase, and as the thickness of the transflective layer increases, the level of light transmittance can decrease.

In detail, the first electrode 211 can include a reflective layer formed of one or more of the following metals: Mg, Ag, Au, Ca, Li, Cr, Al, and Cu, and a transparent conductive layer formed on the reflective layer. In this instance, the transparent conductive layer can be formed of transparent conductive oxide (TCO), for example, one or more of the following materials: indium tin oxide (ITO), indium zinc oxide (IZO), zinc oxide (ZnO), aluminum zinc oxide (AZO), and indium oxide ($In_2O_3$). Since such a transparent conductive layer has a relatively high work function, hole injection through the first electrode 211 can be readily performed.

In addition, the first electrode 211 can have a triple-layer structure in which a transparent conductive layer, a reflective layer, and a transparent conductive layer are sequentially stacked.

The second electrode 213 can include a transflective layer formed of one or more of the following metals: Mg, Ag, Au, Ca, Li, Cr, Al, and Cu.

Although not illustrated, at least one of a hole injection layer (HIL) and a hole transporting layer (HTL) can further be interposed between the first electrode 211 and the organic light emitting layer 212. In addition, at least one of an electron transporting layer (ETL) and an electron injection layer (EIL) can further be interposed between the organic light emitting layer 212 and the second electrode 213.

The organic light emitting layer 212, the HIL, the HTL, the ETL, and the EIL can be referred to as an organic layer. Such an organic layer can be formed of a low molecular weight organic material or a polymer organic material.

The PDL 391 can have an aperture. The aperture of the PDL 391 can expose a portion of the first electrode 211. The first electrode 211, the organic light emitting layer 212, and the second electrode 213 can be sequentially stacked in the aperture of the PDL 391. The second electrode 213 can be formed on the organic light emitting layer 212 and on the PDL 391. The PDL 391 can define a light emission area.

Although not illustrated, a capping layer can be formed on the second electrode 213. The capping layer (not illustrated) can protect the OLED 210.

In order to protect the OLED 210, the second substrate 312 can be formed on the OLED 210 to be opposite to the first substrate 311. The second substrate 312 can be formed of the same material as that forming the first substrate 311.

The polarizer 101 can be formed on the display panel 301. The polarizer 101 according to the fourth exemplary embodiment can have the same configuration as that of the polarizer according to the first exemplary embodiment. In detail, the polarizer 101 can be formed on the second substrate 312 corresponding to a display surface of the display panel 301. In this instance, the polarizer 101 can be adhered to the second substrate 312 by the adhesive layer 160. Since a description pertaining to the configuration of the polarizer 101 is provided with reference to the first exemplary embodiment, a detailed description thereof will be omitted herein for conciseness.

Figure 8:
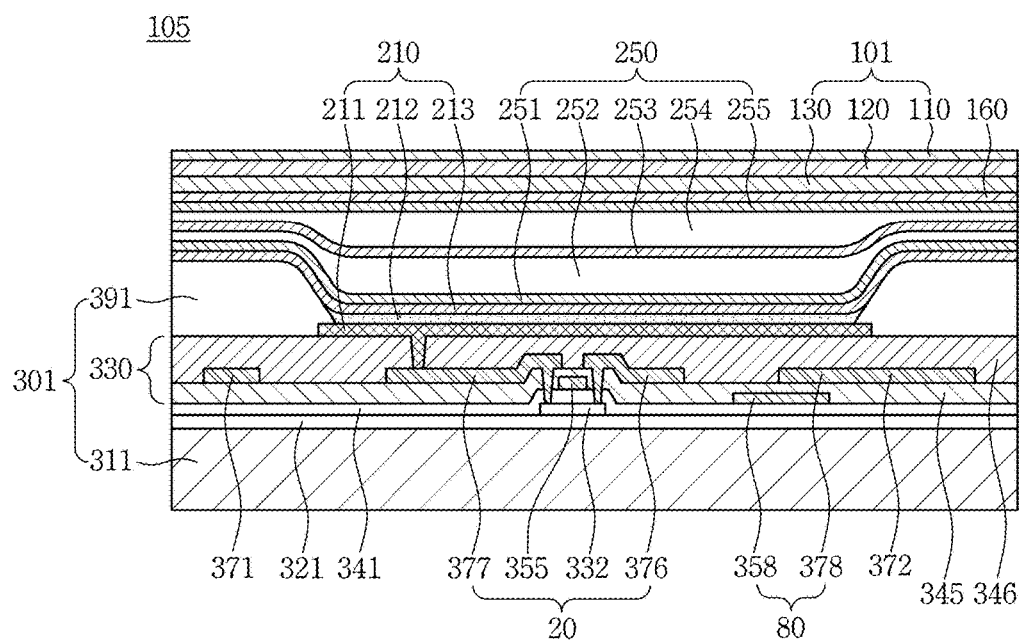
FIG. 8 is a cross-sectional view illustrating an OLED display device according to a fifth exemplary embodiment.

Hereinafter, a fifth exemplary embodiment will be described with reference to FIG. 8. FIG. 8 is a cross-sectional view illustrating an OLED display 105 according to the fifth exemplary embodiment.

The OLED display 105 according to the fifth exemplary embodiment can include a thin film encapsulation layer 250 formed on an OLED 210.

The thin film encapsulation layer 250 can include one or more inorganic layers 251, 253, and 255 and one or more organic layers 252 and 254. The thin film encapsulation layer 250 can have a structure in which the inorganic layers 251, 253, and 255 and the organic layers 252 and 254 are alternately stacked. In this instance, the inorganic layer 251 can be formed as a lowermost layer of the stacked structure of the thin film encapsulation layer 250. For example, the inorganic layer 251 is formed to be most adjacently to the OLED 210. Although FIG. 8 illustrates the thin film encapsulation layer 250 as including the three inorganic layers 251, 253, and 255 and the two organic layers 252 and 254, the fifth exemplary embodiment is not limited thereto.

The inorganic layers 251, 253, and 255 can be formed of one or more of the following materials: $Al_2O_3$, $TiO_2$, ZrO, $SiO_2$, AlON, AlN, SiON, $Si_3N_4$, ZnO, and $Ta_2O_5$. The inorganic layers 251, 253, and 255 can be formed through a chemical vapor deposition (CVD) process or an atomic layer deposition (ALD) process. However, the fifth exemplary embodiment is not limited thereto, and the inorganic layers 251, 253, and 255 can be formed through various processes known in the pertinent art.

The organic layers 252 and 254 can be formed of a polymer-based material. Such a polymer-based material can include an acrylic resin, an epoxy resin, polyimide, polyethylene, and the like. The organic layers 252 and 254 can be formed through a thermal deposition process. The thermal deposition process for forming the organic layers 252 and 254 can be performed within the range of temperature in which the OLED 210 is not damaged. However, the fifth exemplary embodiment is not limited thereto, and the organic layers 252 and 254 can be formed through various processes known in the pertinent art.

The inorganic layers 251, 253, and 255 formed to have a high density of a thin film can serve to reduce or effectively prevent the infiltration of moisture or oxygen thereinto. The infiltration of moisture or oxygen into the OLED 210 can be prevented largely by the inorganic layers 251, 253, and 255.

Moisture or oxygen passing through the inorganic layers 251, 253, and 255 can be blocked further by the organic layers 252 and 254. The organic layers 252 and 254 can exhibit relatively low efficiency in preventing the moisture infiltration, as compared to the inorganic layers 251, 253, and 255. However, the organic layers 252 and 254 can also serve as a buffer layer to reduce stress between respective layers of the inorganic layers 251, 253, and 255 and the organic layers 252 and 254, aside from preventing the moisture infiltration. Further, since the organic layers 252 and 254 have a planarization property, an uppermost surface of the thin film encapsulation layer 250 can be planarized.

The thin film encapsulation layer 250 can have a thickness of about 10 μm or less. Accordingly, an overall thickness of the OLED display 102 can be significantly reduced.

The polarizer 101 can be formed on the thin film encapsulation layer 250. The polarizer 101 can use the polarizer according to the first exemplary embodiment.

As set forth above, according to at least one of the disclosed embodiments, the polarizer can include the phase difference plate having refractive index anisotropy, and can effectively prevent reflection of an external light irrespective of an incident angle of the external light. In addition, the display device can include the polarizer capable of effectively preventing reflection of external light, can be excellent in representing a black color, and can have a high contrast ratio.

From the foregoing, it will be appreciated that various embodiments in accordance with the present disclosure have been described herein for purposes of illustration, and that various modifications can be made without departing from the scope and spirit of the present teachings. Accordingly, the various embodiments disclosed herein are not intended to be limiting of the true scope and spirit of the present teachings. Various features of the above described and other embodiments can be mixed and matched in any manner, to produce further embodiments consistent with the invention.

What is claimed is:

1. A polarizer comprising:
   a linear polarizer; and
   a phase retardation layer on the linear polarizer and comprising a quarter-wave plate and a half-wave plate,
   wherein the half-wave plate comprises a refractive index anisotropic layer,
   wherein the refractive index anisotropic layer has a refractive index Nx defined in a direction of an x axis, a refractive index Ny defined in a direction of a y axis, and a refractive index Nz defined in a direction of a z axis,
   wherein the linear polarizer, the quarter-wave plate and the half-wave plate are arranged along the z axis, and
   wherein Nx=Nz>Ny.

2. The polarizer of claim 1, wherein the refractive index anisotropic layer comprises a liquid crystal layer.

3. The polarizer of claim 2, wherein the liquid crystal layer comprises a discotic compound.

4. The polarizer of claim 3, wherein the discotic compound has a disc surface, and wherein the disc surface has an inclination angle in the range of about 60 degrees to about 90 degrees with respect to a surface of the half-wave plate.

5. The polarizer of claim 1, wherein each of Nx and Nz is in the range of about 1.6 to about 1.8.

6. The polarizer of claim 1, wherein Ny is in the range of about 1.5 to about 1.7.

7. The polarizer of claim 1, wherein the difference between Nx and Ny is in the range of about 0.05 to about 0.2.

8. The polarizer of claim 1, wherein the refractive index anisotropic layer has a thickness in the range of about 1 micrometer (μm) to about 5 μm.

9. The polarizer of claim 1, wherein the refractive index anisotropic layer has a thickness of "a" μm, and wherein "b"=Nx−Ny, where 0.1<a×b<0.5.

10. The polarizer of claim 1, wherein the half-wave plate comprises an alignment layer, and wherein the refractive index anisotropic layer is on the alignment layer.

11. The polarizer of claim 1, wherein the quarter-wave plate comprises a cyclic olefin polymer (COP).

12. The polarizer of claim 1, wherein the quarter-wave plate is on the linear polarizer, and wherein the half-wave plate is on the quarter-wave plate.

13. The polarizer of claim 1, wherein the half-wave plate is on the linear polarizer, and the quarter-wave plate is on the half-wave plate.

14. A polarizer comprising:
a linear polarizer; and
a quarter-wave plate on the linear polarizer; and
a half-wave plate on the quarter-wave plate and comprising a refractive index anisotropic layer,
wherein the refractive index anisotropic layer has a refractive index Nx defined in a direction of an x axis, a refractive index Ny defined in a direction of a y axis, and a refractive index Nz defined in a direction of a z axis,
wherein the linear polarizer, the quarter-wave plate and the half-wave plate are arranged along the z axis, and wherein Nx=Nz>Ny.

15. The polarizer of claim 14, wherein each of the half-wave and quarter-wave plates is thinner than the linear polarizer.

* * * * *